(12) United States Patent
Kim et al.

(10) Patent No.: US 8,149,030 B2
(45) Date of Patent: Apr. 3, 2012

(54) CLOCK GENERATOR TO REDUCE LONG TERM JITTER

(75) Inventors: Chul-woo Kim, Seoul (KR); Woo-seok Kim, Suwon-si (KR); Min-young Song, Seoul (KR); Jae-jin Park, Seongnam-si (KR); Ji-hyun Kim, Gwacheon-si (KR); Young-ho Kwak, Seoul (KR)

(73) Assignees: Samsung Electronics Co., Ltd., Suwon-Si (KR); Korea University Research and Business Foundation, Seongbuk-Gu, Seoul (KR)

( * ) Notice: Subject to any disclaimer, the term of this patent is extended or adjusted under 35 U.S.C. 154(b) by 252 days.

(21) Appl. No.: 12/691,023

(22) Filed: Jan. 21, 2010

(65) Prior Publication Data

US 2010/0244914 A1 Sep. 30, 2010

(30) Foreign Application Priority Data

Mar. 30, 2009 (KR) .................. 10-2009-0026948

(51) Int. Cl.
*H03L 7/06* (2006.01)
(52) U.S. Cl. ........................ 327/156; 327/147
(58) Field of Classification Search ................ None
See application file for complete search history.

(56) References Cited

U.S. PATENT DOCUMENTS

| 6,121,811 | A * | 9/2000 | Scott et al. | 327/276 |
| 7,212,050 | B2 * | 5/2007 | Meltzer | 327/156 |
| 7,741,886 | B2 * | 6/2010 | Tsai | 327/117 |
| 8,050,376 | B2 * | 11/2011 | Liu et al. | 375/376 |
| 2006/0267647 | A1 * | 11/2006 | Chang | 327/156 |

FOREIGN PATENT DOCUMENTS

| JP | 09-153262 | 6/1997 |
| JP | 2000-174620 | 6/2000 |
| KR | 1019960006943 | 5/1996 |
| KR | 1020040064861 | 7/2004 |

* cited by examiner

*Primary Examiner* — Cassandra Cox
(74) *Attorney, Agent, or Firm* — F. Chau & Associates, LLC

(57) ABSTRACT

A clock generator includes a controller, a digital phase locked loop (PLL) circuit, a charge pump phase locked loop (PLL) circuit and a divider. The controller generates a division factor and a first internal clock signal in response to a low-frequency reference clock signal and a multiplication factor. The digital PLL circuit generates a second internal clock signal in response to the reference clock signal, the division factor and the first internal clock signal. The charge pump PLL circuit generates a plurality of third internal clock signals by using the second internal clock signal. The divider generates a high-frequency clock signal in response to a phase selection signal, the division factor and the third internal clock signals.

20 Claims, 5 Drawing Sheets

CLOCK GENERATOR TO REDUCE LONG TERM JITTER

CROSS-REFERENCE TO RELATED APPLICATIONS

This application claims priority to Korean Patent Application No. 10-2009-0026948, filed on Mar. 30, 2009, in the Korean Intellectual Property Office, the disclosure of which is incorporated by reference in its entirety herein.

BACKGROUND

1. Technical Field

Embodiments of the inventive concept relate to a clock generator used in a display driver, and more particularly, to a clock generator to reduce long term jitter.

2. Discussion of Related Art

A digital signal converted from an analog video signal may be reproduced through corresponding pixels of an image to generate a viewable image corresponding to the analog video signal. A pixel clock signal may be used to temporally and spatially reproduce the digital signal converted from the analog video signal. The pixel clock signal may be synchronized with a horizontal synchronous signal and have a specific frequency and phase. The pixel clock signal may be generated by a pixel clock generator. The pixel clock generator may use a phase locked loop (PLL), which includes a charge pump PLL circuit and a digital PLL circuit. A PLL is a control system that generates a signal that has a fixed relation to the phase of a reference signal. A PLL responds to both the frequency and the phase of the input signals, automatically raising or lowering the frequency of a controlled oscillator until it is matched to the reference in both frequency and phase.

If the pixel clock signal generated by the pixel clock generator does not have a regular phase, an image reproduced by using the pixel clock signal may not be properly displayed. An irregular phase of the pixel clock signal may be caused by long term jitter. For a charge pump PLL, which generates a high frequency signal by using a low frequency signal, long term jitter may be generated due to leakage current generated from the charge pump PLL when a metal line pitch is reduced to decrease the circuit area and power consumption. The digital PLL circuit may remove the long term jitter generated in the charge pump PLL circuit and reduce the circuit area and power consumption. However, the digital PLL circuit may have a large number of transistors as compared to the charge pump PLL circuit, and thus phase noise increases and 1/f noise generated from a digitally controlled oscillator included therein also increases. Further, the dynamic range (e.g., the ratio between the smallest and largest possible values of a changeable quantity) of a signal output from the digital PLL circuit is restricted, and thus a jitter component is generated.

SUMMARY

A clock according to an exemplary embodiment of the inventive concept includes a controller, a digital PLL circuit, a charge pump PLL circuit, and a divider. The controller generates a division factor and a first internal clock signal in response to the low-frequency reference clock signal and a multiplication factor. The digital PLL circuit generates a second internal clock signal in response to the low-frequency reference clock signal, the division factor and the first internal clock signal. The charge pump PLL circuit generates a plurality of third internal clock signals by using the second internal clock signal. The divider generates the high-frequency clock signal in response to a phase selection signal, the division factor and the third internal clock signals.

The controller may include a counter, a first register block, a second register block, a first subtractor, a frequency lock detector, a third register block, a second subtractor, an adder, a fourth register block, and a digitally controlled oscillator. The counter counts the first internal clock signal. The first register block stores the output signal of the counter in response to the low-frequency reference clock signal. The second register block stores the output signal of the first register block in response to the low-frequency reference clock signal. The first subtractor calculates a difference between the output signals of the first and second register blocks. The frequency lock detector determines whether the frequency of the low-frequency reference clock signal is locked. The third register block generates and stores the division factor by using the output signal of the frequency lock detector and the multiplication factor according to the low-frequency reference clock signal. The second subtractor calculates a difference between the output signal of the first subtractor and the division factor. The adder performs an AND operation on the output signal of the second subtractor and a delayed signal to generate a 0th internal clock signal. The fourth register block stores the 0th internal clock signal in response to the low-frequency reference clock signal. The digitally controlled oscillator generates the first internal clock signal in response to the 0th internal clock signal.

The digital PLL circuit may include a frequency phase detector, a first coarse time-to-digital converter, a hierarchical time-to-digital converter, a first loop filter, a second loop filter, a third loop filter, a sigma delta converter, a digitally controlled oscillator, and an internal divider. The frequency phase detector compares the frequency and phase of the low-frequency reference clock signal to those of a divided signal and generates an up signal and a down signal. The first coarse time-to-digital converter generates a first converted signal by using the up signal and the down signal according to the first internal clock signal. The hierarchical time-to-digital converter generates a second converted signal by using the up signal and the down signal. The first loop filter filters part of a plurality of data signals output from the first coarse time-to-digital converter to generate a coarse converted signal. The second loop filter filters data signals among the plurality of data signals output from the first coarse time-to-digital converter other than the data signals filtered by the first loop filter to generate a fine converted signal. The third loop filter filters data output from the hierarchical time-to-digital converter. The sigma delta converter dithers data output from the third loop filter to generate a dithering converted signal. The digitally controlled oscillator generates the second internal clock signal by using the coarse converted signal, the fine converted signal and the dithering converted signal. The internal divider divides the second internal clock signal according to the division factor to generate the divided signal.

A clock generator according to an exemplary embodiment of the inventive concept includes a controller, a digital phase locked loop (PLL), a charge pump PLL, and a divider. The controller generates a division factor and a first internal clock signal in response to a low-frequency reference clock signal and a multiplication factor. The PLL circuit generates a second internal clock signal in response to the low-frequency reference clock signal, the division factor and the first internal clock signal. The charge pump PLL generates a plurality of third internal clock signals by using the second internal clock signal. The divider generates a high-frequency clock signal in response to a phase selection signal, the division factor and the third internal clock signals. The divider includes a plurality of phase divider circuits each generating four phase divided signals having a phase difference of 90°. Each phase divider circuit outputs two of the four phase divided signals to a subsequent phase divider circuit.

A clock generator according to an exemplary embodiment of the inventive concept includes a controller, a digital phase locked loop (PLL), a charge pump PLL, and a divider. The controller generates a division factor and a first internal clock signal in response to a low-frequency reference clock signal and a multiplication factor. The PLL generates a second internal clock signal in response to the low-frequency reference clock signal, the division factor and the first internal clock signal. The charge pump PLL generates a plurality of third internal clock signals by using the second internal clock signal. The divider generates a high-frequency clock signal in response to a phase selection signal, the division factor and the third internal clock signals. The divider includes a first selector selecting part of the third internal clock signals based on the phase selection signal and the division factor, a phase divider block generating a plurality of phase divided signals having different phases by using the selected third internal clock signals, and a second selector selecting one of the plurality of phase divided signals as the clock signal according to the third internal clock signals selected by the first selector.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1:
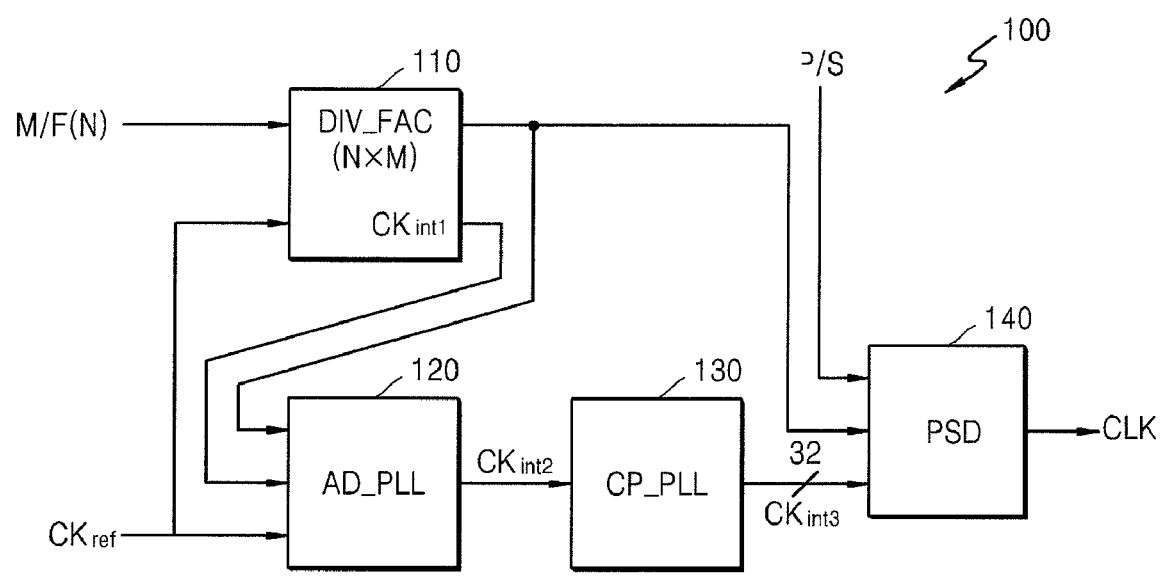
FIG. 1 is a block diagram of a clock generator according to an exemplary embodiment of the inventive concept.

Hereinafter, the inventive concept will be described in detail by explaining exemplary embodiments thereof with reference to the attached drawings. Like reference numerals in the drawings denote like elements.

A clock generator according to at least one exemplary embodiment of the inventive concept converts an input low-frequency signal into a high-frequency signal having a frequency corresponding to an M×N multiple of the frequency of the low-frequency signal by using a digital PLL circuit, filters noise generated in the digital PLL circuit, and increases the frequency of the output signal of the digital PLL circuit by using a charge pump PLL circuit to minimize the generation of jitter and maximize the dynamic range of the output clock signal. The value N may be applied from an external device and the value M may be automatically determined by an internal controller of the clock generator. The clock generator may divide a signal generated by the charge pump PLL circuit by M to increase the dynamic range of the signal.

FIG. 1 is a block diagram of a clock generator 100 according to an exemplary embodiment of the inventive concept that may reduce long term jitter. Referring to FIG. 1, the clock generator 100 includes a controller 110, a digital PLL circuit 120, a charge pump PLL circuit 130, and a divider 140.

The controller 110 generates a division factor DIV_FAC (e.g., M*N) and a first internal clock signal CKint1 in response to a reference clock signal CKref and a multiplication factor M/F (e.g., N). The digital PLL circuit 120 generates a second internal clock signal CKint2 in response to the reference clock signal CKref, the first internal clock signal CKint1 and the division factor DIV_FAC. The charge pump PLL circuit 130 generates a plurality of third internal clock signals CKint3 by using the second internal clock signal CKint2. The divider 140 generates a clock signal CLK in response to a phase selection signal P/S, the division factor DIV_FAC and the third internal clock signals CKint3. The plurality of third internal clock signals CKint3 has the same frequency but different phases. The charge pump PLL circuit 130 generates 32 the third internal clock signals CKint3.

For convenience of explanation, it is assumed that the clock signal CLK has a frequency in the range of about 100 MHz to about 300 MHz and is generated using a horizontal synchronous signal used in a display driving circuit.

According to the assumption, the reference clock signal CKref has a frequency in the range of about 100 KHz to about 110 KHz, the second internal clock signal CKint2 has a frequency in the range of about 100 MHz to about 200 MHz, and the third internal clock signals CKint3 have a frequency in the range of about 200 MHz to about 400 MHz. For example, the digital PLL circuit 120 may increase the frequency of the reference clock signal CKref by at least 10,000 times to generate the second internal clock signal CKint2 and the charge pump PLL circuit 130 doubles the frequency of the second internal clock signal CKint2 and divides the second internal clock signal CKint2 into 32 signals respectively having different phases.

The frequency range of the generated clock signal CLK corresponds to about 100 MHz to about 300 MHz, and thus the third internal clock signals CKint3 having the frequency range of about 200 MHz to about 400 MHz may be used as the clock signal CLK or may be divided and used as the clock signal CLK. Here, the multiple 10,000 or the doubling of the frequency of the reference clock signal CKref or the second internal clock signal CKint2 may be varied if required. The frequency and phase of the clock signal CLK are determined according to M (e.g., an integer) and N (e.g., an integer), wherein M may be determined by the controller 110 and N may be applied from an external device. Here, N corresponds to the multiplication factor M/F applied by an external device and M×N corresponds to the division factor DIV_FAC.

Figure 2:
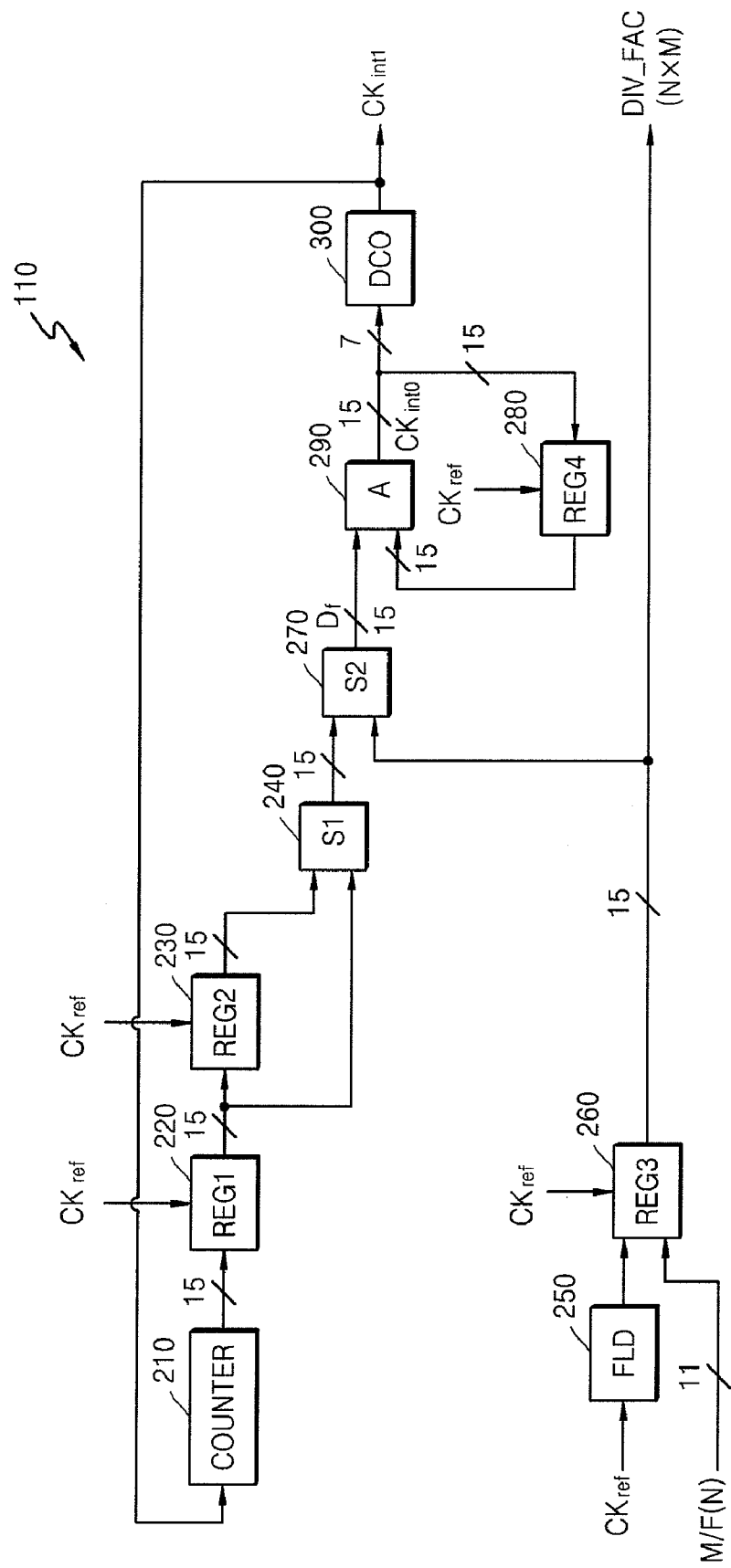
FIG. 2 is a block diagram of a controller of the clock generator illustrated in FIG. 1, according to an exemplary embodiment of the inventive concept.

FIG. 2 is a block diagram of the controller 110 of the clock generator 100 illustrated in FIG. 1, according to an exemplary embodiment of the inventive concept. Referring to FIG. 2, the controller 110 includes a counter 210, a first register block 220 (e.g., REG1), a second register block 230 (e.g., REG2), a first subtractor 240 (e.g., S1), a frequency lock detector 250 (e.g., FLD), a third register block 260 (e.g., REG3), a second subtractor 270 (e.g., S2), an adder 290 (e.g., A), a fourth register block 280 (e.g., REG4), and a digitally controlled oscillator 300 (e.g., DCO).

The counter 210 counts the first internal clock signal CKint1. For example, the counter 210 may count the number of pulses of the first internal clock signal CKint1 during a given period and output a signal indicative of that count. The first register block 220 stores the output signal of the counter 210 in response to the reference clock signal CKref. The second register block 230 stores the output signal of the first register block 220 in response to the reference clock signal CKref. The first subtractor 240 calculates a difference between the output signals of the first register block 220 and the second register block 230. The frequency lock detector 250 determines whether the frequency of the reference clock signal CKref is locked. The third register block 260 may include a plurality of shift registers, which generate the division factor DIV_FAC by using the output signal of the frequency lock detector 250 and the multiplication factor M/F according to the reference clock signal CKref, and shift and store the division factor DIV_FAC. The second subtractor 270 calculates a difference between the output signal of the first subtractor 240 and the division factor DIV_FAC.

A phase difference D(z) in the z domain of the output signal of the second subtractor 270 may be represented according to Equation 1.

$$D_f(z) = K_D((N \times M)f_{CKref} - f_{CKint1})$$ [Equation 1]

Here, $K_D$ is an arbitrary coefficient.

The adder 290 performs an AND operation on the output signal of the second subtractor 270 and a delayed signal output from a fourth register block 280 to generate a 0th internal clock signal CKint0. The frequency of the 0th internal clock signal CKint0 in the time domain may be represented according to Equation 2.

$$f_{CKint0}(z) = \frac{K_D((N \times M)f_{CKref} - f_{CKint1})}{1 - z^{-1}}$$ [Equation 2]

The fourth register block 280 stores digital data and outputs the delayed signal corresponding to the 0th internal clock signal CKint0 in response to the reference clock signal CKref. The digitally controlled oscillator 300 generates the first internal clock signal CKint1 in response to part of the digital data corresponding to the internal clock signal CKint0.

Figure 3:
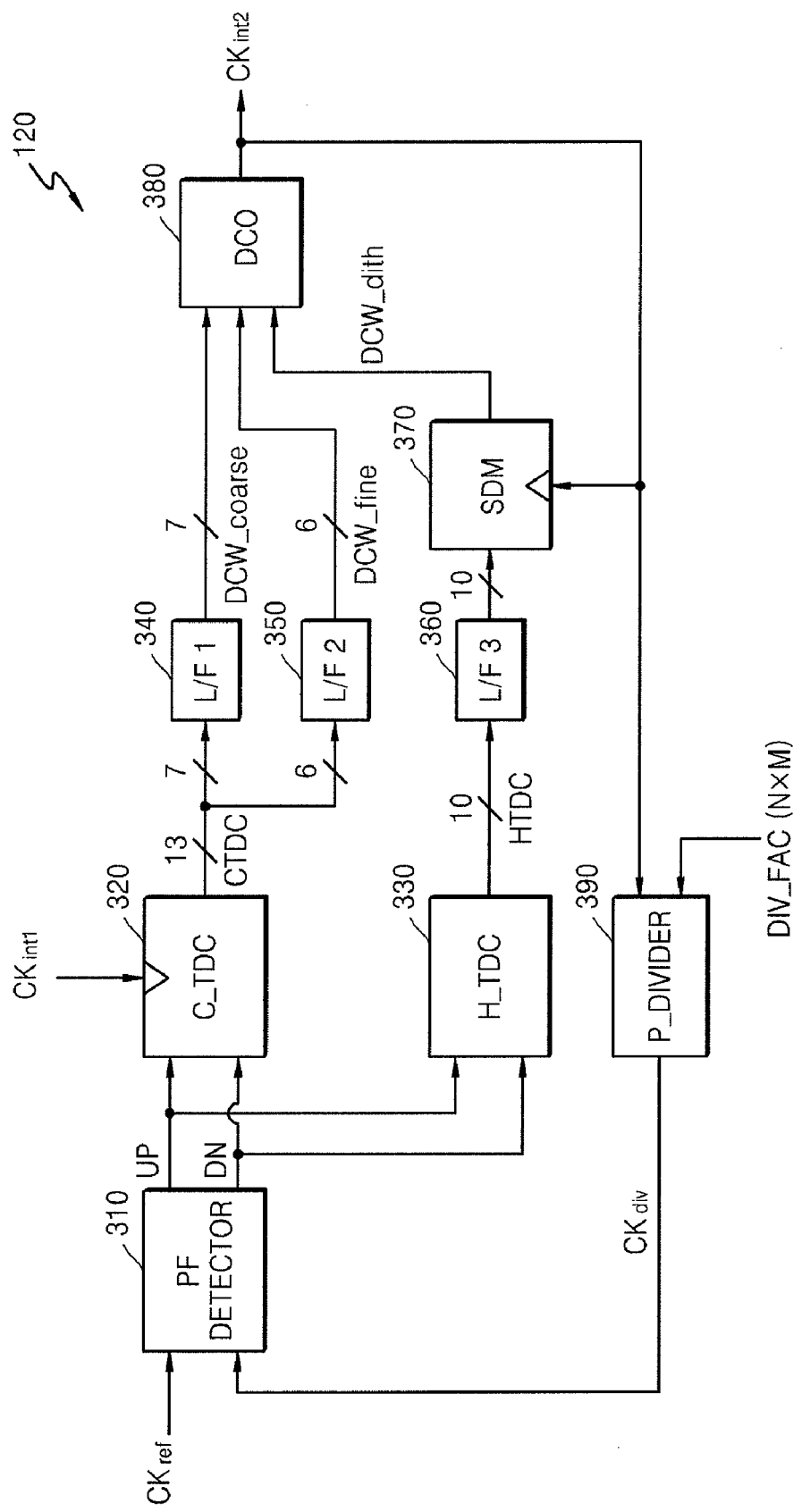
FIG. 3 is a block diagram of a digital PLL circuit of the clock generator illustrated in FIG. 1, according to an exemplary embodiment of the inventive concept.

FIG. 3 is a block diagram of the digital PLL circuit 120 of the clock generator 100 illustrated in FIG. 1, according to an exemplary embodiment of the inventive concept. Referring to FIG. 3, the digital circuit PLL 120 includes a frequency phase detector 310, a first coarse time-to-digital converter 320 (e.g., C_TDC), a hierarchical time-to-digital converter 330 (e.g., H_TDC), a first loop filter 340 (e.g., L/F1), a second loop filter 350 (e.g., L/F2), a third loop filter 360 (e.g., L/F3), a sigma delta modulator 370 (e.g., SDM), a digitally controlled oscillator 380 (e.g., DCO), and an internal divider 390.

The frequency phase detector 310 compares the frequency and phase of the reference clock signal CKref to those of a divided signal CKdiv and generates an up signal UP and a down signal DN. The first coarse time-to-digital converter 320 generates a first converted signal CTDC by using the up signal UP and the down signal DN in response to the first internal clock signal CKint1. The hierarchical time-to-digital converter 330 generates a second converted signal HTDC by using the up signal UP and the down signal DN. The first loop filter 340 filters part of a plurality of data signals output from the first coarse time-to-digital converter 320 to generate a coarse converted signal DCW_coarse. The second loop filter 350 filters data signals output from the first coarse time-to-digital converter 320 other than the data signals filtered by the first loop filter 340 to generate a fine converted signal DCW_fine. The third loop filter 360 filters data output from the hierarchical time-to-digital converter 330. The sigma delta modulator 370 dithers data output from the third loop filter 360 to generate a dithering converted signal DCW_dith. The digitally controlled oscillator 380 generates the second internal clock signal CKint2 by using the coarse converted signal DCW_coarse, the fine converted signal DCW_fine and the dithering converted signal DCW_dith. The internal divider 390 is programmable and divides the second internal clock signal CKint2 according to the division factor DIV_FAC to generate the divided signal CKdiv.

Dithering is an operation which mixes colors other than a required color to make a color similar to the required color when the required color is not available. For example, dithering means making a color similar to a certain color by using pixels in displayable colors when the certain color cannot be displayed. For example, gray may be made by controlling a mixture ratio of a black pixel to a white pixel instead of using a gray pixel.

The digital PLL circuit 120 may use dithering to overcome a restriction on a target frequency due to limited resolution of an internal digital signal. For example, a target frequency may be obtained by adjusting the rate of two neighboring frequencies which are respectively higher and lower than the target frequency.

Figure 4:
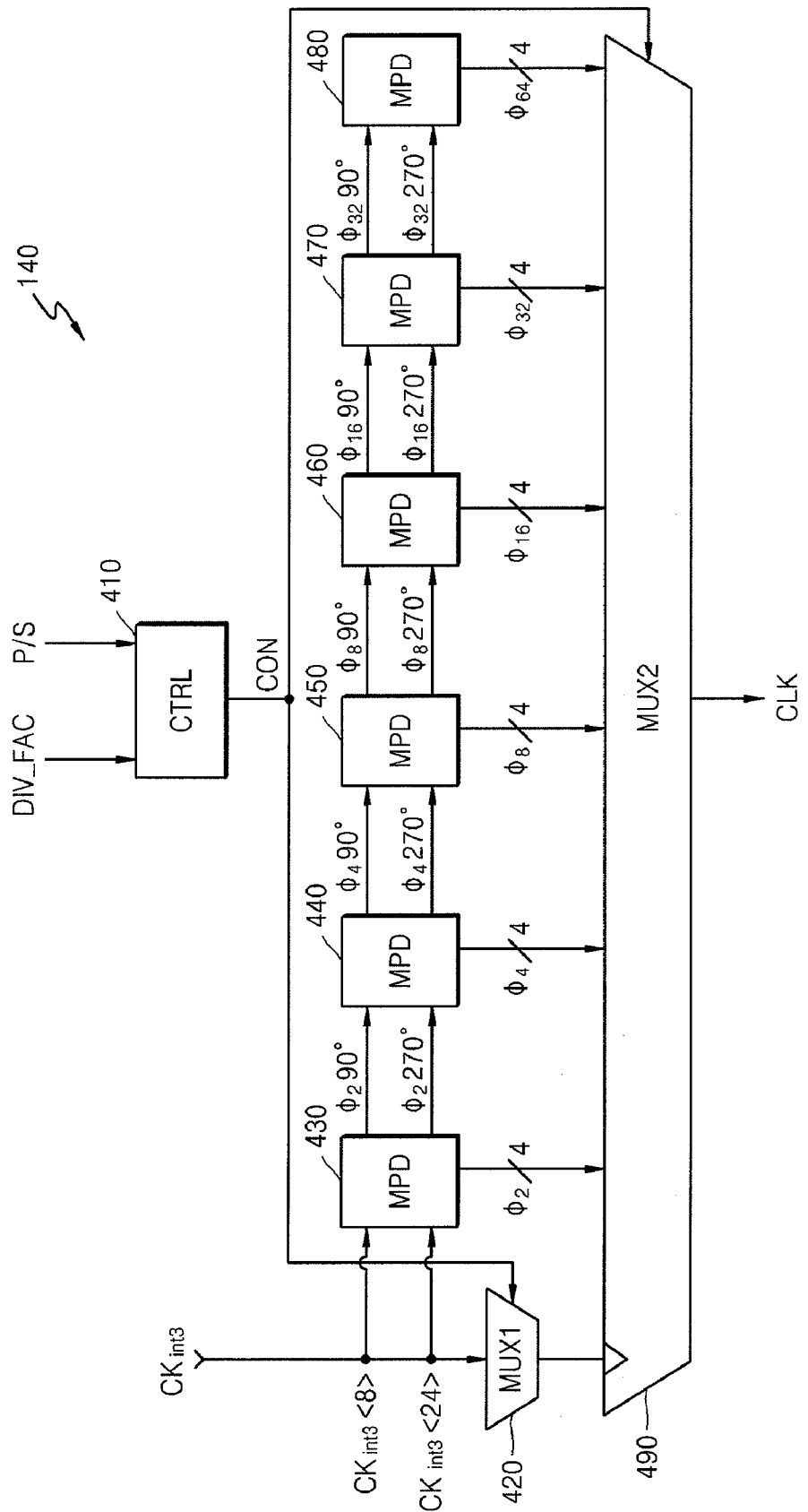
FIG. 4 is a block diagram of a frequency divider of the clock generator illustrated in FIG. 1, according to an exemplary embodiment of the inventive concept.

FIG. 4 is a block diagram of the divider 140 of the clock generator 100 illustrated in FIG. 1, according to an exemplary embodiment of the inventive concept. Referring to FIG. 4, the divider 140 includes a control circuit 410 (e.g., CTRL), a first selector 420 (e.g., MYX1), a phase divider block having first through sixth phase divider circuits 430 through 480 (e.g., MPD), and a second selector 490 (e.g., MUX2).

The control circuit 410 generates a control signal CON by using the phase selection signal P/S and the division factor DIV_FAC. The first selector 420 (e.g., a first multiplexer MUX1) selects part of the third internal clock signals CKint3 in response to the control signal CON. The phase divider circuits 430 through 480 generate a plurality of phase divided signals $\phi_2$ through $\phi_{64}$ respectively having different phases by using the selected third internal clock signals CKint3. The second selector 490 (e.g., a second multiplexer MUX2) selects one of the plurality of phase division signals $\phi_2$ through $\phi_{64}$ as the clock signal CLK according to the third internal clock signals CKint3 selected by the first selector 420.

The first phase divider circuit 430 generates four first phase divided signals $\phi_2,0°$, $\phi_2,90°$, $\phi_2,180°$ and $\phi_2,270°$ having a phase difference of 90° by using two signals CKint3<8> and CKint3<24> among the third internal clock signals CKint3. The signals CKint3<8> and CKint3<0> have a phase difference of 90° and the signals CKint3<24> and CKint3<0> have a phase difference of 270° based on the phase of CKint3<0>. The second phase divider circuit 440 generates four second phase divided signals $\phi_4,0°$, $\phi_4,90°$, $\phi_4,180°$ and $\phi_4,270°$ having a phase difference of 90° by using two signals $\phi_2,90°$ and $\phi_2,270°$ among the four first phase divided signals $\phi_2,0°$, $\phi_2,90°$, $\phi_2,180°$ and $\phi_2,270°$ generated by the first phase divider circuit 430. The third, fourth, fifth and sixth phase divider circuits 450, 460, 470 and 480 operate in the same manner that the second phase divider circuit 440 operates, and thus only the operation of the sixth phase divider circuit 480 will be described below.

The sixth phase divider circuit 480 generates four Kth phase divided signals $\phi_{64},0°$, $\phi_{64},90°$, $\phi_{64},180°$ and $\phi_{64},270°$ having a phase difference of 90° by using two signals $\phi_{32},90°$ and $\phi_{32},270°$ among four (K−1)th phase divided signals $\phi_{32}, 0°$, $\phi_{32},90°$, $\phi_{32},180°$ and $\phi_{32},270°$ generated by the fifth phase divider circuit 470.

Here, the frequencies of the signals output from the first phase divider circuit 430 correspond to twice the frequencies of the signals output from the second phase divider circuit 440 and the frequencies of the signals output from the second phase divider circuit 440 correspond to twice the frequencies of the signals output from the third phase divider circuit 450. In this manner, the frequencies of the signals output from the fifth phase divider circuit 470 become twice the frequencies of the signals output from the sixth phase divider circuit 480.

All the four phase divided signals generated by the first through sixth phase divider circuits 430 through 480 are applied to the second selector 490. Two phase divided signals (e.g., 90° and)270° having the same phase are output from a phase divider circuit of the phase divider block to each subsequent phase divider circuit in the block.

Figure 5:
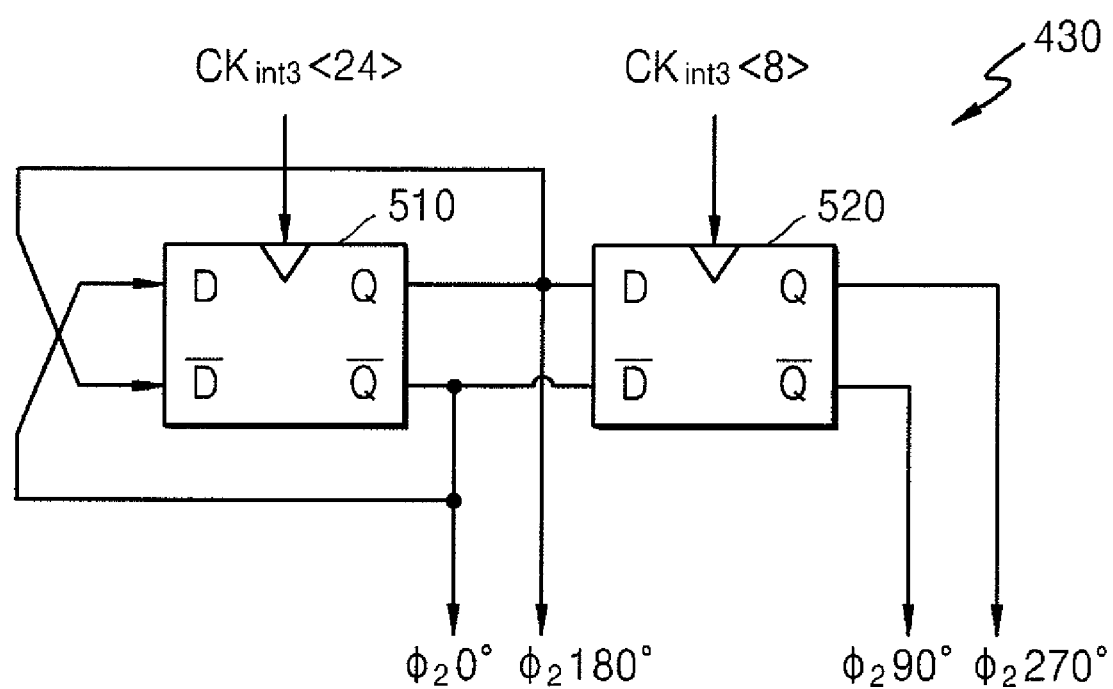
FIG. 5 is circuit diagram of a phase divider circuit of the clock generator illustrated in FIG. 4, according to an exemplary embodiment of the inventive concept.

FIG. 5 is a circuit diagram of the phase divider circuit 430 of the divider 140 illustrated in FIG. 4, according to an exemplary embodiment of the inventive concept. Referring to FIG. 5, the phase divider circuit 430 includes a 1st phase divider 510 and a 2nd phase divider 520.

The 1st phase divider 510 has a first input terminal D connected to a second output terminal $\overline{Q}$ thereof and a second input terminal $\overline{D}$ connected to a first output terminal Q thereof and determines logic values of the first output terminal Q and the second output terminal $\overline{Q}$ in response to the third internal clock signal CKint3<24> among the third internal clock signals CKint3. The 2nd phase divider 520 has a first input terminal D connected to the first output terminal Q of the 1st phase divider 510 and a second input terminal $\overline{D}$ connected to the second output terminal $\overline{Q}$ of the 1st phase divider 510 and varies the phases of the first and second terminals Q and $\overline{Q}$ in response to the third internal clock signal CKint3<8> among the third internal clock signals CKint3.

The second phase division circuit 440 illustrated in FIG. 4 includes a 3rd phase divider (not shown) and a 4th phase divider (not shown) that may be similar in structure to those shown in FIG. 5. The 3rd phase divider (not shown) has a first input terminal connected to a second output terminal thereof and a second input terminal connected to a first output terminal thereof and determines logic values of the first and second output terminals in response to one of two signals output from the first phase division circuit 430 illustrated in FIG. 4. The 4th phase divider (not shown) has a first input terminal connected to the first output terminal of the 3rd phase divider (not shown) and a second input terminal connected to the second output terminal of the 3rd phase divider (not shown) and varies the phases of the first and second terminals in response to the other one of the two signals output from the first phase division circuit 430 illustrated in FIG. 4.

The sixth phase division circuit 480 illustrated in FIG. 4 includes a 5th phase divider (not shown) and a 6th phase divider (not shown) that may be similar in structure to those shown in FIG. 5. The 5th phase divider (not shown) has a first input terminal connected to a second output terminal thereof and a second input terminal connected to a first output terminal thereof and determines logic values of the first and second terminals in response to one of two signals output from the (K−1)th phase division circuit 470. The 6th phase divider (not shown) has a first input terminal connected to the first output terminal of the 5th phase divider (not shown) and a second input terminal connected to the second output terminal of the 5th phase divider (not shown) and varies the phases of the first and second output terminals in response to the other one of the two signals output from the (K−1)th phase divider (not shown).

As described above, a clock generator according to at least one exemplary embodiment of the inventive concept uses a digital PLL circuit and a charge pump PLL circuit for the low-frequency reference clock signal CKref input thereto to minimize the influence of jitter and noise. For example, the digital PLL circuit minimizes long term jitter while generating a high-frequency signal and the charge pump PLL circuit filters 1/f noise that may be generated in the digital PLL circuit. Further, the clock generator according to at least one exemplary embodiment of the inventive concept internally determines the division factor for generating a high-frequency signal to maximize the dynamic ranges of the PLL circuits.

Moreover, a clock generator according to at least one exemplary embodiment of the inventive concept may generate clock signals having various phases by using a division factor and a plurality of dividers, select a clock signal having a desired phase and maintain the selected clock signal.

While the inventive concept has been particularly shown and described with reference to exemplary embodiments thereof, it will be understood that various changes in form and details may be made therein without departing from the spirit and scope of the disclosure.

What is claimed is:

1. A clock generator comprising:
 a controller generating a division factor and a first internal clock signal in response to a low-frequency reference clock signal and a multiplication factor;
 a digital phase locked loop (PLL) circuit generating a second internal clock signal in response to the low-frequency reference clock signal, the division factor and the first internal clock signal;
 a charge pump PLL circuit generating a plurality of third internal clock signals by using the second internal clock signal; and
 a divider generating a high-frequency clock signal in response to a phase selection signal, the division factor and the third internal clock signals.

2. The clock generator of claim 1, wherein the high-frequency clock signal is at least 10,000 times the frequency of the low-frequency clock signal.

3. The clock generator of claim 1, wherein the plurality of third internal clock signals has the same frequency and different phases.

4. The clock generator of claim 1, wherein the third internal clock signals have a frequency higher than the second internal clock signal and the second internal clock signal has a frequency higher than the first internal clock signal.

5. The clock generator of claim 1, wherein the controller comprises:
 a counter counting the first internal clock signal;
 a first register block storing the output signal of the counter in response to the low-frequency reference clock signal;
 a second register block storing the output signal of the first register block in response to the low-frequency reference clock signal;
 a first subtractor calculating a difference between the output signals of the first and second register blocks;
 a frequency lock detector determining whether the frequency of the low-frequency reference clock signal is locked;
 a third register block generating and storing the division factor by using the output signal of the frequency lock detector and the multiplication factor according to the low-frequency reference clock signal;
 a second subtractor calculating a difference between the output signal of the first subtractor and the division factor;
 an adder performing an AND operation on the output signal of the second subtractor and a delayed signal to generate a $0^{th}$ internal clock signal;

a fourth register block storing the $0^{th}$ internal clock signal in response to the low-frequency reference clock signal; and a digitally controlled oscillator generating the first internal clock signal in response to the $0^{th}$ internal clock signal.

6. The clock generator of claim 5, wherein the third register block comprises a plurality of shift registers shifting the division factor according to the low-frequency reference clock signal.

7. The clock generator of claim 1, wherein the digital PLL circuit comprises:

a frequency phase detector comparing the frequency and phase of the low-frequency reference clock signal to those of a divided signal and generating an up signal and a down signal;

a first coarse time-to-digital converter generating a first converted signal by using the up signal and the down signal according to the first internal clock signal;

a hierarchical time-to-digital converter generating a second converted signal by using the up signal and the down signal;

a first loop filter filtering part of a plurality of data signals output from the first coarse time-to-digital converter to generate a coarse converted signal;

a second loop filter filtering data signals among the plurality of data signals output from the first coarse time-to-digital converter other than the data signals filtered by the first loop filter, to generate a fine converted signal;

a third loop filter filtering data output from the hierarchical time-to-digital converter;

a sigma delta converter dithering data output from the third loop filter to generate a dithering converted signal;

a digitally controlled oscillator generating the second internal clock signal by using the coarse converted signal, the fine converted signal and the dithering converted signal; and an internal divider dividing the second internal clock signal according to the division factor to generate the divided signal.

8. The clock generator of claim 1, wherein the divider comprises:

a control circuit generating a control signal by using the phase selection signal and the division factor;

a first selector selecting part of the third internal clock signals in response to the control signal;

a phase divider block generating a plurality of phase divided signals having different phases by using the selected third internal clock signals; and a second selector selecting one of the plurality of phase divided signals as the clock signal according to the third internal clock signals selected by the first selector in response to the control signal.

9. The clock generator of claim 8, wherein the phase divider block comprises:

a first phase divider circuit generating four first phase divided signals having a phase difference of 90° by using two of the third internal clock signals;

a second phase divider circuit generating four second phase divided signals having a phase difference of 90° by using two of the four first phase divided signals; and a Kth phase divider circuit generating four Kth phase divided signals having a phase difference of 90° by using two of four (K−1)th phase divided signals generated by a (K−1)th phase divider circuit, and the frequencies of signals output from the first phase divider circuit correspond to twice the frequencies of signals output from the second phase divider circuit and the frequencies of signals output from the (K−1)th phase divider circuit correspond to twice the frequencies of signals output from the Kth phase divider circuit, wherein K is an integer equal to or greater than 3.

10. The clock generator of claim 9, wherein the two signals selected by the first through Kth phase divider circuits have the same phases.

11. The clock generator of claim 9, wherein the first phase divider circuit comprises:

a 1st phase divider having a first input terminal connected to a second output terminal thereof and a second input terminal connected to a first output terminal thereof, the $1^{st}$ divider determining logic values of the first and second output terminals in response to one of the third internal clock signals; and a 2nd phase divider having a first input terminal connected to the first output terminal of the 1st phase divider and a second input terminal connected to the second output terminal of the 1st phase divider and varying the phases of the first and second output terminals in response to another one of the third internal clock signals.

12. The clock generator of claim 9, wherein the second phase divider circuit comprises:

a 1st phase divider having a first input terminal connected to a second output terminal thereof and a second input terminal connected to a first output terminal thereof, the 1st phase divider determining logic values of the first and second output terminals in response to one of two signals output from the first phase divider circuit; and a 2nd phase divider having a first input terminal connected to the first output terminal of the 1st phase divider and a second input terminal connected to the second output terminal of the 1st phase divider and varying the phases of the first and second output terminals in response to the other one of the two signals output from the first phase divider circuit.

13. The clock generator of claim 9, wherein the Kth phase divider circuit comprises:

a 1st phase divider having a first input terminal connected to a second output terminal thereof and a second input terminal connected to a first output terminal thereof, the $1^{st}$ phase divider determining logic values of the first and second output terminals in response to one of two signals output from the (K−1)th phase divider circuit; and a 2nd phase divider having a first input terminal connected to the first output terminal of the 1st phase divider and a second input terminal connected to the second output terminal of the 1st phase divider and varying the phases of the first and second output terminals in response to the other one of the two signals output from the (K−1)th phase divider circuit.

14. A clock generator comprising:

a controller generating a division factor and a first internal clock signal in response to a low-frequency reference clock signal and a multiplication factor;

a digital phase locked loop (PLL) circuit generating a second internal clock signal in response to the low-frequency reference clock signal, the division factor and the first internal clock signal;

a charge pump PLL circuit generating a plurality of third internal clock signals by using the second internal clock signal; and a divider generating a high-frequency clock signal in response to a phase selection signal, the division factor and the third internal clock signals, wherein the divider comprises a plurality of phase divider circuits each generating four phase divided signals having a phase difference of 90°, wherein each phase divider circuit outputs two of the four phase divided signals to a subsequent phase divider circuit.

15. The clock generator of claim 14, wherein the phases of the two phase divided signals are 90 degrees and 270 degrees.

16. The clock generator of claim 14, wherein the high-frequency clock signal is at least 10,000 times the frequency of the low-frequency clock signal.

17. The clock generator of claim 14, wherein the plurality of third internal clock signals have the same frequency and different phases.

18. The clock generator of claim 14, wherein the third internal clock signals have a frequency higher than the second internal clock signal and the second internal clock signal has a frequency higher than the first internal clock signal.

19. A clock generator comprising:
   a controller generating a division factor and a first internal clock signal in response to a low-frequency reference clock signal and a multiplication factor;
   a digital phase locked loop (PLL) circuit generating a second internal clock signal in response to the low-frequency reference clock signal, the division factor and the first internal clock signal;
   a charge pump PLL circuit generating a plurality of third internal clock signals by using the second internal clock signal; and
   a divider generating a high-frequency clock signal in response to a phase selection signal, the division factor and the third internal clock signals,
   wherein the divider comprises:
      a first selector selecting part of the third internal clock signals based on the phase selection signal and the division factor;
      a phase divider block generating a plurality of phase divided signals having different phases by using the selected third internal clock signals; and
      a second selector selecting one of the plurality of phase divided signals as the clock signal according to the third internal clock signals selected by the first selector.

20. The clock generator of claim 19, wherein the plurality of third internal clock signals has the same frequency and different phases.

* * * * *